(12) United States Patent
Mao et al.

(10) Patent No.: US 11,802,074 B2
(45) Date of Patent: Oct. 31, 2023

(54) HIGH-TENSION BUSBAR SILVER PASTE APPLIED TO N-TYPE SOLAR CELL AND PREPARATION METHOD THEREFOR

(71) Applicant: NANTONG T-SUN NEW ENERGY CO., LTD., Nantong (CN)

(72) Inventors: Ping Mao, Nantong (CN); Shu Zhang, Nantong (CN); Yulong Guan, Nantong (CN); Huan Yang, Nantong (CN)

(73) Assignee: NANTONG T-SUN NEW ENERGY CO., LTD., Nantong (CN)

( * ) Notice: Subject to any disclaimer, the term of this patent is extended or adjusted under 35 U.S.C. 154(b) by 0 days.

(21) Appl. No.: 17/777,953

(22) PCT Filed: Nov. 30, 2020

(86) PCT No.: PCT/CN2020/132701
§ 371 (c)(1),
(2) Date: May 18, 2022

(87) PCT Pub. No.: WO2022/041538
PCT Pub. Date: Mar. 3, 2022

(65) Prior Publication Data
US 2023/0183126 A1    Jun. 15, 2023

(30) Foreign Application Priority Data
Aug. 26, 2020  (CN) .......................... 202010869014.2

(51) Int. Cl.
*H01B 1/16*       (2006.01)
*C03C 8/00*       (2006.01)
(Continued)

(52) U.S. Cl.
CPC .................. *C03C 4/14* (2013.01); *C03C 8/02* (2013.01); *C03C 8/16* (2013.01); *C03C 8/18* (2013.01);
(Continued)

(58) Field of Classification Search
CPC .... H01B 1/16; H01B 1/22; C09D 5/24; H01L 31/0224; C03C 8/02
See application file for complete search history.

(56) References Cited

U.S. PATENT DOCUMENTS 11,450,447 B2 *  9/2022  Hui .......................... H01B 1/22
2015/0243812 A1 *  8/2015  Hardin ............ H01L 31/022425
252/514

(Continued)

OTHER PUBLICATIONS

English language translation of form PCT/ISA/237 (mailed Apr. 2021).*

(Continued)

*Primary Examiner* — Mark Kopec
(74) *Attorney, Agent, or Firm* — CBM PATENT CONSULTING, LLC

(57) ABSTRACT

A high-tension busbar silver paste applied to the N-type solar cell is prepared by mixing a silver powder (a mixture of a spherical silver powder A having a median particle size of 700-900 nm and a tapped density of 5-6 g/mL and a spherical silver powder B having a medium particle size of 280-450 nm and a tapped density of 4-5 g/mL), an organic vehicle (a mixture of 3-5 wt % of polyvinyl butyral resin and 5-10 wt % of acrylic resin as a main resin) and a glass powder (copper-bismuth-manganese-tellurium series glass powder having a medium particle size of 0.7-1 μm and a softening temperature of 600-800° C.); the silver paste has large welding tension, in which the welding tension of the front busbar line is 4 N or more.

8 Claims, 8 Drawing Sheets

(51) Int. Cl.
     *C03C 4/14*           (2006.01)
     *C03C 8/02*           (2006.01)
     *C03C 8/16*           (2006.01)
     *C03C 8/18*           (2006.01)
     *H01L 31/0224*     (2006.01)

(52) U.S. Cl.
     CPC ....... *H01B 1/16* (2013.01); *H01L 31/022441* (2013.01); *C03C 2205/00* (2013.01)

(56) References Cited

U.S. PATENT DOCUMENTS

2017/0141248 A1*   5/2017   Song .................... C09D 11/033
2019/0181276 A1*   6/2019   Park ......................... H01B 1/22

OTHER PUBLICATIONS

CN 111564235 (pub date Aug. 21, 2020) English language machine translation.*
Hwang et al "Sintering behavior of silver conductive thick film with frit in information display", J Electroceram (2009) 23:351-355.*
Li et al "Effect of spherical silver powders with different sizes in back electrode paste . . . ", J Mater Sci: Mater Electron (2015) 26:2471-2479.*
Lin et al "Effect of surface properties of silver powder on the sintering of its thick-film conductor", Materials Chemistry and Physics 45 (1996) 253-261.*

* cited by examiner

HIGH-TENSION BUSBAR SILVER PASTE APPLIED TO N-TYPE SOLAR CELL AND PREPARATION METHOD THEREFOR

TECHNICAL FIELD

The present invention relates to the technical field of conductive materials containing metals or alloys, and particularly relates to a high-tension busbar silver paste applied to an N-type solar cell and a preparation method therefor.

BACKGROUND

The commercialized crystalline silicon solar cells are mainly made of P-type crystalline silicon, and the P-type crystalline silicon solar cell is obtained through texturing, diffusion, etching and trimming, silicon nitride antireflection film plating, and line producing processes such as front silver grid line printing, and printing of back aluminum and back silver electrodes. The P-N junction of the P-type crystalline silicon solar cell is positioned on the front surface of the cell, and photo-generated carriers in the P-type base electrode can be transported to the front surface of the cell through diffusion to be effectively separated, thereby realizing photoelectric conversion. According to the International Technology Roadmap for PV (ITRPV), the P-type crystalline silicon solar cell has a relatively high market share. The traditional P-type crystalline silicon solar cells are made of P-type crystalline silicon, and its inner boron-oxygen complex is gradually activated under illumination to form a trap center, so that the photoelectric conversion efficiency of the corresponding cell is reduced, and the light attenuation degree of a crystalline silicon photovoltaic module is high. The solar cell made of N-type crystalline silicon has a relatively low light attenuation degree, and thus can avoid the light attenuation present in the traditional P-type crystalline silicon solar cell.

The front silver paste for an N-type solar cell is a raw material in the N-type crystalline silicon cell, the cost of which is second to that of an N-type silicon wafer, and the quality of which directly influences performances of the cell, which in turn determines the grade of the cell. The silver paste for an N-type solar cell consists of particles of metal silver of high purity (99.9%), an inorganic glass phase and an organic vehicle. The grade, content, shape and size of the components are closely related to the performances of the silver paste for the N-type solar cell, and the components have different properties and play different roles in the paste. The silver powder is used as a conductive functional phase, and the quality of the silver powder directly influences the bulk resistance, contact resistance and the like of the electrode materials. The inorganic system is a high-temperature bonding phase, which mainly acts to allow the adhesion of the front silver paste to the silicon wafer, and also has a non-negligible effect on the sintering of the silver powder, so that it is crucial to the formation of a good ohmic contact between silver and silicon. The organic vehicle is used as a key component for carrying the silver powder and the inorganic system, and has a great effect on printing performance, printing quality and the like. The organic vehicle is generally a complex of a resin and a solvent, wherein the resin acts to increase plasticity and form a network structure, and the organic solvent acts to dissolve the resin, wet the silver powder and the inorganic system and adjust the viscosity.

Journal of *Electronic Materials* has reported a paper entitled with Research on Influence of Silver Powder Morphology on the Adhesion of the Front Silver Paste, in which the influence of roughness of the surface of the silver powder on the adhesion of the front silver paste was described in detail, and the experiment showed that the rougher the surface of the silver powder, the larger the adhesion of the front silver paste, and when cavities exist on the surface of the silver powder, the inner part of the silver powder is communicated with the glass powder in the sintering process, so that the formed adhesion of the front silver paste is the largest. Journal of Precious Metals has reported a paper entitled with Influence of the Content and the Particle Size of the Lead-free Glass Powder on the Performance of Silver Paste, which mentioned that when the particle size of the glass powder became smaller, the glass phase wet silver particles uniformly, and the silver particles were tightly connected, so that a compact silver film was formed after the sintering, which had a reduced porosity and an enhanced adhesion.

In order to collect and conduct the current generated by the N-type solar cell, it is necessary to prepare a busbar electrode and secondary grid line electrodes on the front surface of the N-type solar cell. The busbar electrode can pool the current on the secondary grid and conduct the pooled current outwards through the welding strip. This requires that the busbar must form a good welding tension with the welding strip in the welding process.

The high busbar tension can greatly reduce the contact loss of the electrodes, prolonging the service life and the power output time of the modules. At present, most of photovoltaic modules are still produced by using an operation process of manual welding to realize the combined connection of the solar cell modules. Factors influencing the welding quality of the busbar and the welding strip mainly include the busbar silver paste, the temperature and time of welding, the welding strip, the welding flux, the welding pressure of manual operation, the temperature returning speed of the welding machine and the like, and these factors determine whether problems such as insufficient welding, over-welding, and poor connection strength of the welding strip and the busbar will occur in the manual welding process resulting from different operators and environmental influences. The insufficient welding will increase the series resistance of the modules, and reduce the current output efficiency of the modules; and the over-welding will cause the deformation and hidden crack of the cell.

SUMMARY

In order to solve the above problems, the present invention provides a high-tension busbar silver paste applied to an N-type solar cell and a preparation method therefor. The specific contents of the present invention are as follows.

One purpose of the present invention is to provide a high-tension busbar silver paste applied to an N-type solar cell, which, by mass of 100 wt %, comprises 80-95 wt % of a silver powder, 8-20 wt % of an organic vehicle and 1-5 wt % of a copper-bismuth-manganese-tellurium glass powder.

The silver powder is a mixture of a spherical silver powder A and a spherical silver powder B, and by mass of 100 wt %, comprises 70-85 wt % of the spherical silver powder A and 15-30 wt % of the spherical silver powder B, wherein the spherical silver powder A has a median particle size of 700-900 nm and a tapped density of 5-6 g/mL, and the spherical silver powder B has a median particle size of 280-450 nm and a tapped density of 4-5 g/mL.

The copper-bismuth-manganese-tellurium glass powder has a median particle size of 0.7-1 μm and a softening temperature of 600-800° C.

The organic vehicle, by mass of 100 wt %, comprises 6-15 wt % of a resin, 80-85 wt % of an organic solvent and 5-10 wt % of an organic auxiliary agent.

The resin has a molecular weight of 1000-50,000, and comprises 3-5 wt % of polyvinyl butyral resin and 5-10 wt % of acrylic resin.

In some embodiments of the present invention, the copper-bismuth-manganese-tellurium glass powder per 100 mol by mixing the following compounds: 50-60 mol % of a copper-containing compound, 2-3 mol % of a bismuth-containing compound, 5-7 mol % of a manganese-containing compound and 2-2.4 mol % of a tellurium-containing compound.

In some embodiments of the present invention, the raw materials for preparing the copper-bismuth-manganese-tellurium series glass powder also include the following compounds: 20-40 mol % of a silicon-containing compound, 0.5-1 mol % of an aluminum-containing compound and 3-3.6 mol % of a titanium-containing compound.

In some embodiments of the present invention, the compounds are at least one of an oxide, a halide, a nitrate compound, a nitrite compound, a carbonate compound, a bicarbonate compound, a sulfate compound, and a phosphate compound.

In some embodiments of the present invention, the resin may also comprise at least one of ethylcellulose resin, rosin resin and phenolic resin.

In some embodiments of the present invention, the organic solvent is at least one of texanol, terpineol, tributyl citrate and butyl carbitol acetate.

In some embodiments of the present invention, the organic auxiliary agent is at least one of a leveling agent, a thixotropic agent, an antifoaming agent, a drier, a dispersant, and a viscosity reducer.

According to the above formula, another purpose of the present invention is to provide a preparation method for the high-tension busbar silver paste applied to the N-type solar cell, which comprises the following steps:

step I: accurately weighing all components using an analytical balance, adding an organic vehicle and a glass powder into a centrifuge tube and uniformly mixing, and then placing the centrifuge tube into a centrifuge and centrifuging for 1-3 times to obtain a glass paste, wherein the centrifuge has a rotating speed of 800-1200 rmp and a centrifuging time of 3-7 min;

step II: placing the glass paste prepared in the step I into a three-roller machine for three-roller grindings, wherein the three-roller machine has a roller spacing of 5-40 μm and a rotating speed of 100-200 rmp; and step III: adding a silver powder into the glass paste after the three-roller grindings in the step II, and centrifuging for 2 times at a rotating speed of 500-600 rmp to obtain the high-tension busbar silver paste applied to the N-type solar cell, wherein the high-tension busbar silver paste applied to the N-type solar cell has a viscosity of 20-30 Pa·s/25° C. at a rotating speed of 10 rmp.

Compared with the Prior Art, the Present Invention has the Following Beneficial Effects The high-tension busbar silver paste applied to the N-type solar cell is prepared by mixing a silver powder (a mixture of a spherical silver powder A having a median particle size of 700-900 nm and a tapped density of 5-6 g/mL and a spherical silver powder B having a medium particle size of 280-450 nm and a tapped density of 4-5 g/mL), an organic vehicle (a mixture of 3-5 wt % of polyvinyl butyral resin and 5-10 wt % of acrylic resin as a main resin) and a glass powder (copper-bismuth-manganese-tellurium series glass powder having a medium particle size of 0.7-1 μm and a softening temperature of 600-800° C.). The formula system allows the silver paste to have good adhesion to the surface of the N-type silicon wafer after the sintering, so that the silver paste has large welding tension, with the welding tension of the front busbar line being 4 N or more, and the paste itself has good compactness and high photoelectric conversion efficiency.

DETAILED DESCRIPTION

Figure 1:
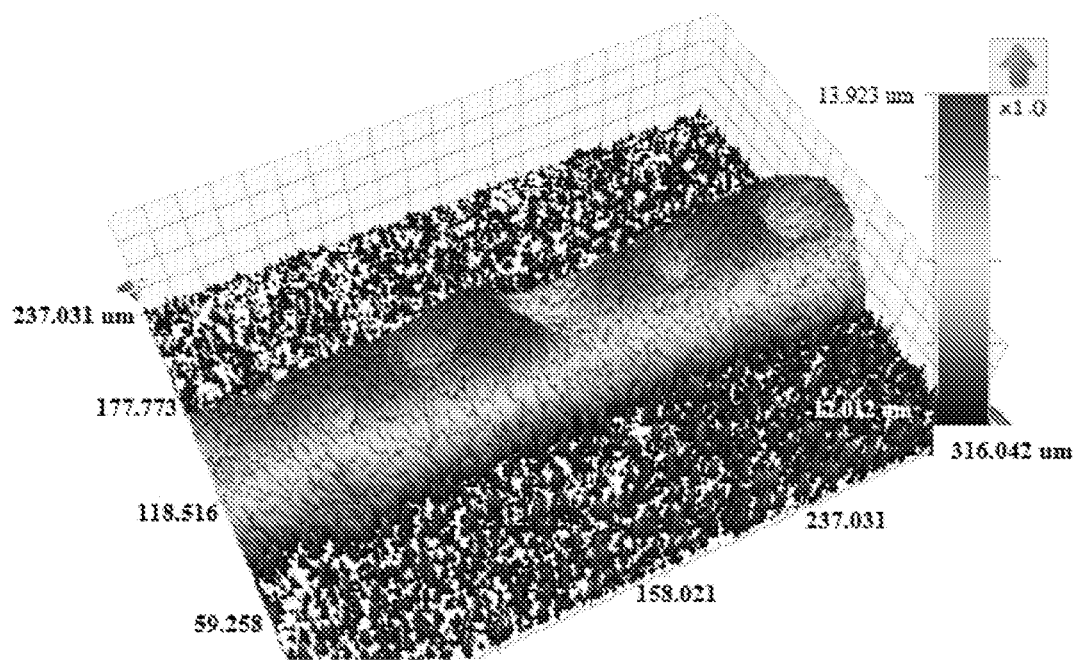
FIG. 1 is a 3D profile scan of the high-tension busbar silver paste applied to the N-type solar cell prepared in Example 1 of the present invention being printed on the N-type solar cell.

The high-tension busbar silver paste applied to the N-type solar cell of the present invention is prepared by mixing 80-95 wt % of a silver powder, 8-20 wt % of an organic vehicle and 1-5 wt % of a glass powder.

The silver powder is used as a main body of the conductive functional phase, and the quality of the silver powder directly influences the bulk resistance, contact resistance and the like of the electrode material, and the particle size distribution, the appearance, the tapped density, the burnout and the like of the silver powder will influence the performance of the electrode.

The glass powder is a high-temperature bonding phase, which mainly acts to allow the adhesion of the N-type front silver paste to the silicon wafer, and also has a non-negligible effect on the sintering of the silver powder, and the components, the sintering temperature, the holding time, the content, the particle size and the like of the glass will influence the aging, deformation and conductivity of the grid lines and the adhesive strength of the paste to the silicon wafer substrate. The expansion coefficient of the glass influences the sealing property, the bonding property and the tension strength of the grid lines and the N-type silicon wafer, and the acid and alkali resistance of the glass can directly influence the service life and the quality of the grid lines.

The organic vehicle is an organic polymer solution which dissolves the auxiliary agents with different functions in an organic solvent, is a vehicle which can mix and bond silver powder with a conductive function and glass powder with a bonding function, and plays an important role in adjusting the viscosity of the paste and control the rheological property of the paste. The organic vehicle disperses various powder mixtures into pastes with fluid properties, so as to facilitate the high-speed and accurate printing of the pastes on the N-type silicon wafer by screen printing to form specific grid line shapes. Therefore, the selection and proportion of different organic vehicles play a crucial role in the overall performance of the N-type busbar silver paste.

Silver Powder

The silver powder of the present invention is a mixture of a spherical silver powder A and a spherical silver powder B, which, by mass of 100 wt %, comprises 70-85 wt % of a spherical silver powder A and 15-30 wt % of a spherical silver powder B, wherein the spherical silver powder A has a median particle size of 700-900 nm and a tapped density of 5-6 g/mL, and the spherical silver powder B has a median particle size of 280-450 nm and a tapped density of 4-5 g/mL.

According to the present invention, the main spherical silver powder A with the median particle size of 700-900 nm and the spherical glass powder B with the median particle size of 280-450 nm are mixed; in this formula system, the spherical glass powder B can fill both the inverted pyramid texture of the silicon wafer in sub-micron size and gaps between the main spherical silver powders A, and in the printing and drying processes, the silver paste can be filled into gaps of the pyramid to better fit the surface of the N-type silicon wafer to ensure that the silver powder is more compactly filled, so that the silver powder is well bonded to the silicon wafer with the help of the glass powder in the sintering process, and meanwhile, the paste is more compactly packed in the sintering process, and thus has better conductive and adhesion properties, thereby improving the welding tension.

Organic Vehicle

The organic vehicle, by mass of 100 wt %, comprises 6-15 wt % of a resin, 80-85 wt % of a solvent, and 5-10 wt % of an organic auxiliary agent, wherein the resin of the present invention has a molecular weight of 1000-50,000, and comprises 3-5 wt % of polyvinyl butyral resin and 5-10 wt % of acrylic resin, the resin of the present invention can also comprise at least one of ethylcellulose resin, rosin resin and phenolic resin; the organic solvent of the present invention is at least one of texanol, terpineol, tributyl citrate and butyl carbitol acetate; and the organic auxiliary agent of the present invention is at least one of a leveling agent, a thixotropic agent, an antifoaming agent, a drier, a dispersant and a viscosity reducer.

According to the present invention, a small molecular weight resin with the molecular weight of 1000-50,000 is used as the main resin, and the resin system has good wettability on the surface of the N-type silicon wafer and the silver powder. The applicant found that the silver paste prepared by the small molecular weight resin can be filled into gaps of a pyramid structure on the surface of the N-type silicon wafer in the processes of printing and drying, so that the silver paste has good wettability on the surface of the N-type silicon wafer. The applicant found that when 3-5 wt % of polyvinyl butyral resin and 5-10 wt % of the small molecular weight resin of acrylic resin are mixed, the prepared silver paste has good wettability on the surface of the N-type silicon wafer and the silver powder, and the organic vehicle of the formula has good adsorbability, and has strong effect on the surface of the N-type silicon wafer, which ensures that the silver paste will not fall off from the surface of the N-type silicon wafer in the drying process. The silver paste comprising the organic vehicle of the present invention undergoes gradient volatilization in the drying process, during which 15 wt % is volatilized at 150-200° C., 85 wt % is volatilized at 200-240° C. and 100 wt % is volatilized at 240-300° C., so that the silver paste will not fall off due to too fast shrinkage caused by volatilization in the drying process, thereby ensuring that the silver layer formed by the silver paste before the sintering and the surface of the N-type silicon wafer have good adhesiveness and the silver layer itself has good compactness.

Glass Powder

The glass powder of the present invention is a copper-bismuth-manganese-tellurium glass powder having a median particle size of 0.7-1 μm and a softening temperature of 600-800° C., and the copper-bismuth-manganese-tellurium glass powder per 100 mol is prepared by mixing 50-60 mol % of a copper-containing compound, 2-3 mol % of a bismuth-containing compound, 5-7 mol % of a manganese-containing compound and 2-2.4 mol % of a tellurium-containing compound. The raw materials for preparing the copper-bismuth-manganese-tellurium series glass powder also include 20-40 mol % of a silicon-containing compound, 0.5-1 mol % of an aluminum-containing compound and 3-3.6 mol % of a titanium-containing compound. The compound of the present invention is at least one of an oxide, a halide, a nitrate compound, a nitrite compound, a carbonate compound, a bicarbonate compound, a sulfate compound and a phosphate compound.

The applicant found through experiments that the copper-bismuth-manganese-tellurium series glass powder used in the present invention has little damage to the passivation layer on the surface of the N-type silicon wafer, the addition of a copper-containing compound, a manganese-containing compound and a tellurium-containing compound in the glass powder system provides good welding tension and aging tension for the glass powder, the addition of a silicon-containing compound and an aluminum-containing compound provides a more complete network structure for the glass powder, and the addition of the bismuth-containing compound improves the wettability of the glass powder and the surface of the N-type silicon wafer.

Preparation Method

According to the above formula, the preparation method for the high-tension busbar silver paste applied to the N-type solar cell of the present invention comprises the following steps:

step I: accurately weighing all components using an analytical balance, adding an organic vehicle and a glass powder into a centrifuge tube and uniformly mixing, and then placing the centrifuge tube into a centrifuge and centrifuging for 1-3 times to obtain a glass paste, wherein the centrifuge has a rotating speed of 800-1200 rmp and a centrifuging time of 3-7 min, and firstly preparing the glass paste to realize the dispersion of a nano system enables the system to be dispersed more uniformly;

step II: placing the glass paste prepared in the step I into a three-roller machine for three-roller grindings, wherein the three-roller machine of the present invention has a roller spacing of 5-40 μm and a rotating speed of 100-200 rmp; the three-roller machine of the present invention has three rollers, wherein a distance between a first roller and a second roller is 40 μm and a distance between the second roller and a third roller is 30 μm during the first three-roller grinding, a distance between the first roller and the second roller is 30 μm and a distance between the second roller and the third roller is 20 μm during the second three-roller grinding, and a distance between the first roller and the second roller is 10 μm and a distance between the second roller and the third roller is 5 μm during the third three-roller grinding, and the obtained glass paste is more uniform after the three times of grinding; and step III: adding a silver powder into the glass paste after the three-roller grindings in the step II, and centrifuging for 2 times at a rotating speed of 500-600 rmp to obtain the high-tension busbar silver paste applied to the N-type solar cell, wherein the high-tension busbar silver paste applied to the N-type solar cell has a viscosity of 20-30 Pa·s/25° C. at a rotating speed of 10 rmp.

The present invention will be further understood by reference to the following detailed description of preferred implementations of the present invention and the examples included therein. Unless otherwise specified, all technical and scientific terms used herein have the same meanings as those commonly understood by those skilled in the art to which the present application belongs. To the extent that a definition of a particular term disclosed in the prior art is inconsistent with any definitions provided herein, the definition of the term provided herein controls.

As used herein, a feature that does not define a singular or plural form is also intended to include a plural form of the feature unless otherwise specified clearly in the context. It will be further understood that the term "prepared from . . . ", as used herein, is synonymous with "containing", "comprising", "including", "having," "contains" and/or "comprises", and when used in the specification, denotes the stated composition, step, method, article, or device, but does not preclude the presence or addition of one or more other compositions, steps, methods, articles, or devices. Furthermore, when describing implementations of the present application, "preferred", "preferably", "more preferably" and the like are used to refer to embodiments of the present invention that may provide certain benefits under certain circumstances. However, other embodiments may also be preferred under the same or other circumstances. In addition, the recitation of one or more preferred embodiments does not imply that other embodiments are not available, nor is it intended to exclude other embodiments from the scope of the present invention.

Example 1

The present invention relates to a high-tension busbar silver paste applied to an N-type solar cell, which comprises the following components:

87.5 wt % of a silver powder: wherein a weight ratio of a spherical silver powder A to a spherical silver powder B is 7:3, the spherical silver powder A has a median particle size of 800 nm and a tapped density of 5.5 g/mL, and the spherical silver powder B has a median particle size of 365 nm and a tapped density of 4.5 g/mL;

10 wt % of an organic vehicle: the organic vehicle of the present invention, by mass of 100%, comprises 10 wt % of a resin (polyvinyl butyral resin:acrylic resin:ethylcellulose resin=3:6:1), 82.5 wt % of an organic solvent (texanol: terpineol:tributyl citrate=20:30:32.5) and 7.5 wt % of an organic auxiliary agent (a leveling agent:a thixotropic agent: an antifoaming agent=2:2:3.5), wherein the polyvinyl butyral resin has a molecular weight of 25,000, the acrylic resin has a molecular weight of 30,000, and the ethylcellulose resin has a molecular weight of 20,000; and 2.5 wt % of a glass powder: the glass powder is a copper-bismuth-manganese-tellurium glass powder having a median particle size of 0.85 μm and a softening temperature of 700° C., and the copper-bismuth-manganese-tellurium glass powder per 100 mol is prepared by mixing 55 mol % of copper oxide, 2.5 mol % of bismuth oxide, 6 mol % of manganese dioxide, 2.2 mol % of tellurium dioxide, 30 mol % of silicon dioxide, 1 mol % of aluminum oxide and 3.3 mol % of titanium dioxide.

According to the above formula, the preparation method for the high-tension busbar silver paste applied to the N-type solar cell of the present invention comprises the following steps:

step I: accurately weighing all components using an analytical balance, adding an organic vehicle and a glass powder into a centrifuge tube and uniformly mixing, and then placing the centrifuge tube into a centrifuge and centrifuging for 2 times to obtain a glass paste, wherein the centrifuge has a rotating speed of 1000 rmp and a centrifuging time of 5 min;

step II: placing the glass paste prepared in the step I into a three-roller machine for three-roller grindings, wherein the three-roller machine of the present invention has three rollers, wherein a distance between a first roller and a second roller is 40 μm and a distance between the second roller and a third roller is 30 μm during the first three-roller grinding, a distance between the first roller and the second roller is 30 μm and a distance between the second roller and the third roller is 20 μm during the second three-roller grinding, and a distance between the first roller and the second roller is 10 μm and a distance between the second roller and the third roller is 5 μm during the third three-roller grinding; each of the three-roller grindings is performed at a rotating speed of 100-200 rmp; and step III: adding a silver powder into the glass paste after the three-roller grindings in the step II, and centrifuging for 2 times at a rotating speed of 550 rmp to obtain the high-tension busbar silver paste applied to the N-type solar cell of the present invention, wherein the high-tension busbar silver paste applied to the N-type solar cell has a viscosity of 25.72 Pa·s/25° C. at a rotating speed of 10 rmp.

Example 2

The present invention relates to a high-tension busbar silver paste applied to an N-type solar cell, which comprises the following components:

80 wt % of a silver powder: wherein a weight ratio of a spherical silver powder A to a spherical silver powder B is 17:3, the spherical silver powder A has a median particle size of 900 nm and a tapped density of 6 g/mL, and the spherical silver powder B has a median particle size of 450 nm and a tapped density of 5 g/mL;

15 wt % of an organic vehicle: the organic vehicle of the present invention, by mass of 100%, comprises 10 wt % of a resin (polyvinyl butyral resin:acrylic resin:rosin resin=4:5:1), 85 wt % of an organic solvent (texanol:terpineol:tributyl citrate:butyl carbitol acetate=4:4:4:5) and 5 wt % of an organic auxiliary agent (a leveling agent:a thixotropic agent:an antifoaming agent:a drier:a dispersant=1:1:1:1:1), wherein the polyvinyl butyral resin has a molecular weight of 40,000, the acrylic resin has a molecular weight of 20,000, and the rosin resin has a molecular weight of 10,000; and 5 wt % of a glass powder: the glass powder is a copper-bismuth-manganese-tellurium glass powder having a median particle size of 0.7 μm and a softening temperature of 600° C., and the copper-bismuth-manganese-tellurium glass powder per 100 mol is prepared by mixing 60 mol % of copper chloride, 2 mol % of bismuth chloride, 5 mol % of manganese chloride, 2 mol % of tellurium chloride, 30 mol % of silicon chloride and 1 mol % of aluminum chloride.

According to the above formula, the preparation method for the high-tension busbar silver paste applied to the N-type solar cell of the present invention comprises the following steps:

step I: accurately weighing all components using an analytical balance, adding an organic vehicle and a glass powder into a centrifuge tube and uniformly mixing, and then placing the centrifuge tube into a centrifuge and centrifuging for 3 times to obtain a glass paste, wherein the centrifuge has a rotating speed of 800 rmp and a centrifuging time of 3 min;

step II: placing the glass paste prepared in the step I into a three-roller machine for three-roller grindings, wherein the three-roller machine of the present invention has three rollers, wherein a distance between a first roller and a second roller is 40 μm and a distance between the second roller and a third roller is 30 μm during the first three-roller grinding, a distance between the first roller and the second roller is 30 μm and a distance between the second roller and the third roller is 20 μm during the second three-roller grinding, and a distance between the first roller and the second roller is 10 μm and a distance between the second roller and the third roller is 5 μm during the third three-roller grinding; each of the three-roller grindings is performed at a rotating speed of 100 rmp; and step III: adding a silver powder into the glass paste after the three-roller grindings in the step II, and centrifuging for 2 times at a rotating speed of 500 rmp to obtain the high-tension busbar silver paste applied to the N-type solar cell of the present invention, wherein the high-tension busbar silver paste applied to the N-type solar cell has a viscosity of 26.04 Pa·s/25° C. at a rotating speed of 10 rmp.

Example 3

The present invention relates to a high-tension busbar silver paste applied to an N-type solar cell, which comprises the following components:

90 wt % of a silver powder: wherein a weight ratio of a spherical silver powder A to a spherical silver powder B is 3:1, the spherical silver powder A has a median particle size of 700 nm and a tapped density of 5 g/mL, and the spherical silver powder B has a median particle size of 280 nm and a tapped density of 4 g/mL;

8 wt % of an organic vehicle: the organic vehicle of the present invention, by mass of 100%, comprises 5 wt % of a resin (polyvinyl butyral resin:acrylic resin:phenolic resin=3:6:1), 85 wt % of an organic solvent (terpineol:tributyl citrate:butyl carbitol acetate=5:6:6) and 10 wt % of an organic auxiliary agent (a leveling agent:a thixotropic agent:an antifoaming agent:a drier:a dispersant:a viscosity reducer=1:1:2:2:2:2), wherein the polyvinyl butyral resin has a molecular weight of 50,000, the acrylic resin has a molecular weight of 3000, and the phenolic resin has a molecular weight of 1000; and 2 wt % of a glass powder: the glass powder is a copper-bismuth-manganese-tellurium glass powder having a median particle size of 1 μm and a softening temperature of 800° C., and the copper-bismuth-manganese-tellurium glass powder per 100 mol is prepared from a mixture of 50 mol % of copper nitrate, 2.5 mol % of bismuth dioxide, 7 mol % of manganese dioxide, 2.4 mol % of tellurium dioxide, 34.8 mol % of silicon dioxide and 3.3 mol % of titanium dioxide.

According to the above formula, the preparation method for the high-tension busbar silver paste applied to the N-type solar cell of the present invention comprises the following steps:

step I: accurately weighing all components using an analytical balance, adding an organic vehicle and a glass powder into a centrifuge tube and uniformly mixing, and then placing the centrifuge tube into a centrifuge and centrifuging for 1 time to obtain a glass paste, wherein the centrifuge has a rotating speed of 1200 rmp and a centrifuging time of 3 min;

step II: placing the glass paste prepared in the step I into a three-roller machine for three-roller grindings, wherein the three-roller machine of the present invention has three rollers, wherein a distance between a first roller and a second roller is 40 μm and a distance between the second roller and a third roller is 30 μm during the first three-roller grinding, a distance between the first roller and the second roller is 30 μm and a distance between the second roller and the third roller is 20 μm during the second three-roller grinding, and a distance between the first roller and the second roller is 10 μm and a distance between the second roller and the third roller is 5 μm during the third three-roller grinding; each of the three-roller grindings is performed at a rotating speed of 200 rmp; and step III: adding a silver powder into the glass paste after the three-roller grindings in the step II, and centrifuging for 2 times at a rotating speed of 600 rmp to obtain the high-tension busbar silver paste applied to the N-type solar cell of the present invention, wherein the high-tension busbar silver paste applied to the N-type solar cell has a viscosity of 25.67 Pa·s/25° C. at a rotating speed of 10 rmp.

Example 4

The present invention relates to a high-tension busbar silver paste applied to an N-type solar cell, which comprises the following components: 87.5 wt % of a silver powder: wherein a weight ratio of a spherical silver powder A to a spherical silver powder B is 7:3, the spherical silver powder A has a median particle size of 800 nm and a tapped density of 5.5 g/mL, and the spherical silver powder B has a median particle size of 365 nm and a tapped density of 4.5 g/mL;

10 wt % of an organic vehicle: the organic vehicle of the present invention, by mass of 100%, comprises 10 wt % of a resin (polyvinyl butyral resin:acrylic resin:ethylcellulose resin=3:6:1), 82.5 wt % of an organic solvent (texanol:terpineol:tributyl citrate=20:30:32.5) and 7.5 wt % of an organic auxiliary agent (a leveling agent:a thixotropic agent:an antifoaming agent=2:2:3.5), wherein the polyvinyl butyral resin has a molecular weight of 25,000, the acrylic resin has a molecular weight of 30,000, and the ethylcellulose resin has a molecular weight of 20,000; and 2.5 wt % of a glass powder: the glass powder is a copper-bismuth-manganese-tellurium glass powder having a median particle size of 0.85 μm and a softening temperature of 700° C., and the copper-bismuth-manganese-tellurium glass powder per 100 mol is prepared by mixing 55 mol % of copper oxide, 2.5 mol % of bismuth oxide, 6 mol % of manganese dioxide, 2.2 mol % of tellurium dioxide, 30 mol % of silicon dioxide, 1 mol % of aluminum oxide and 3.3 mol % of titanium dioxide.

According to the above formula, the preparation method for the high-tension busbar silver paste applied to the N-type solar cell of the present invention comprises the following steps:

step I: accurately weighing all components using an analytical balance, adding an organic vehicle and a glass powder into a centrifuge tube and uniformly mixing, and then placing the centrifuge tube into a centrifuge and centrifuging for 3 times to obtain a glass paste, wherein the centrifuge has a rotating speed of 800 rmp and a centrifuging time of 3 min;

step II: placing the glass paste prepared in the step I into a three-roller machine for three-roller grindings, wherein the three-roller machine of the present invention has three rollers, wherein a distance between a first roller and a second roller is 40 μm and a distance between the second roller and a third roller is 30 μm during the first three-roller grinding, a distance between the first roller and the second roller is 30 μm and a distance between the second roller and the third roller is 20 μm during the second three-roller grinding, and a distance between the first roller and the second roller is 10 μm and a distance between the second roller and the third roller is 5 μm during the third three-roller grinding; each of the three-roller grindings is performed at a rotating speed of 100 rmp; and step III: adding a silver powder into the glass paste after the three-roller grindings in the step II, and centrifuging for 2 times at a rotating speed of 500 rmp to obtain the high-tension busbar silver paste applied to the N-type solar cell of the present invention, wherein the high-tension busbar silver paste applied to the N-type solar cell has a viscosity of 26.04 Pa·s/25° C. at a rotating speed of 10 rmp.

Example 5

The present invention relates to a high-tension busbar silver paste applied to an N-type solar cell, which comprises the following components:

90 wt % of a silver powder: wherein a weight ratio of a spherical silver powder A to a spherical silver powder B is 3:1, the spherical silver powder A has a median particle size of 700 nm and a tapped density of 5 g/mL, and the spherical silver powder B has a median particle size of 280 nm and a tapped density of 4 g/mL;

8 wt % of an organic vehicle: the organic vehicle of the present invention, by mass of 100%, comprises 5 wt % of a resin (polyvinyl butyral resin:acrylic resin:phenolic resin=3:6:1), 85 wt % of an organic solvent (terpineol:tributyl citrate:butyl carbitol acetate=5:6:6) and 10 wt % of an organic auxiliary agent (a leveling agent:a thixotropic agent:an antifoaming agent:a drier:a dispersant:a viscosity reducer=1:1:2:2:2:2), wherein the polyvinyl butyral resin has a molecular weight of 50,000, the acrylic resin has a molecular weight of 3000, and the phenolic resin has a molecular weight of 1000; and 2 wt % of a glass powder: the glass powder is a copper-bismuth-manganese-tellurium glass powder having a median particle size of 1 μm and a softening temperature of 800° C., and the copper-bismuth-manganese-tellurium glass powder per 100 mol is prepared from a mixture of 50 mol % of copper nitrate, 2.5 mol % of bismuth dioxide, 7 mol % of manganese dioxide, 2.4 mol % of tellurium dioxide, 34.8 mol % of silicon dioxide and 3.3 mol % of titanium dioxide.

According to the above formula, the preparation method for the high-tension busbar silver paste applied to the N-type solar cell of the present invention comprises the following steps:

step I: accurately weighing all components using an analytical balance, adding an organic vehicle and a glass powder into a centrifuge tube and uniformly mixing, and then placing the centrifuge tube into a centrifuge and centrifuging for 2 times to obtain a glass paste, wherein the centrifuge has a rotating speed of 1000 rmp and a centrifuging time of 5 min;

step II: placing the glass paste prepared in the step I into a three-roller machine for three-roller grindings, wherein the three-roller machine of the present invention has three rollers, wherein a distance between a first roller and a second roller is 40 μm and a distance between the second roller and a third roller is 30 μm during the first three-roller grinding, a distance between the first roller and the second roller is 30 μm and a distance between the second roller and the third roller is 20 μm during the second three-roller grinding, and a distance between the first roller and the second roller is 10 μm and a distance between the second roller and the third roller is 5 μm during the third three-roller grinding; each of the three-roller grindings is performed at a rotating speed of 100-200 rmp; and step III: adding a silver powder into the glass paste after the three-roller grindings in the step II, and centrifuging for 2 times at a rotating speed of 550 rmp to obtain the high-tension busbar silver paste applied to the N-type solar cell of the present invention, wherein the high-tension busbar silver paste applied to the N-type solar cell has a viscosity of 25.72 Pa·s/25° C. at a rotating speed of 10 rmp.

Comparative Example 1

The "87.5 wt % of a silver powder: wherein a weight ratio of a spherical silver powder A to a spherical silver powder B is 7:3, the spherical silver powder A has a median particle size of 800 nm and a tapped density of 5.5 g/mL, and the spherical silver powder B has a median particle size of 365 nm and a tapped density of 4.5 g/mL;" in Example 1 is replaced with "87.5 wt % of a silver powder: wherein the silver powder is totally a spherical silver powder A, and the spherical silver powder A has a median particle size of 800 nm and a tapped density of 5.5 g/mL;". The remaining operations are the same as those in Example 1, and the high-tension busbar silver paste applied to the N-type solar cell of Comparative Example 1 has a viscosity of 25.80 Pa·s/25° C. at a rotating speed of 10 rmp, which is measured using the same viscometer.

Comparative Example 2

Figure 8:
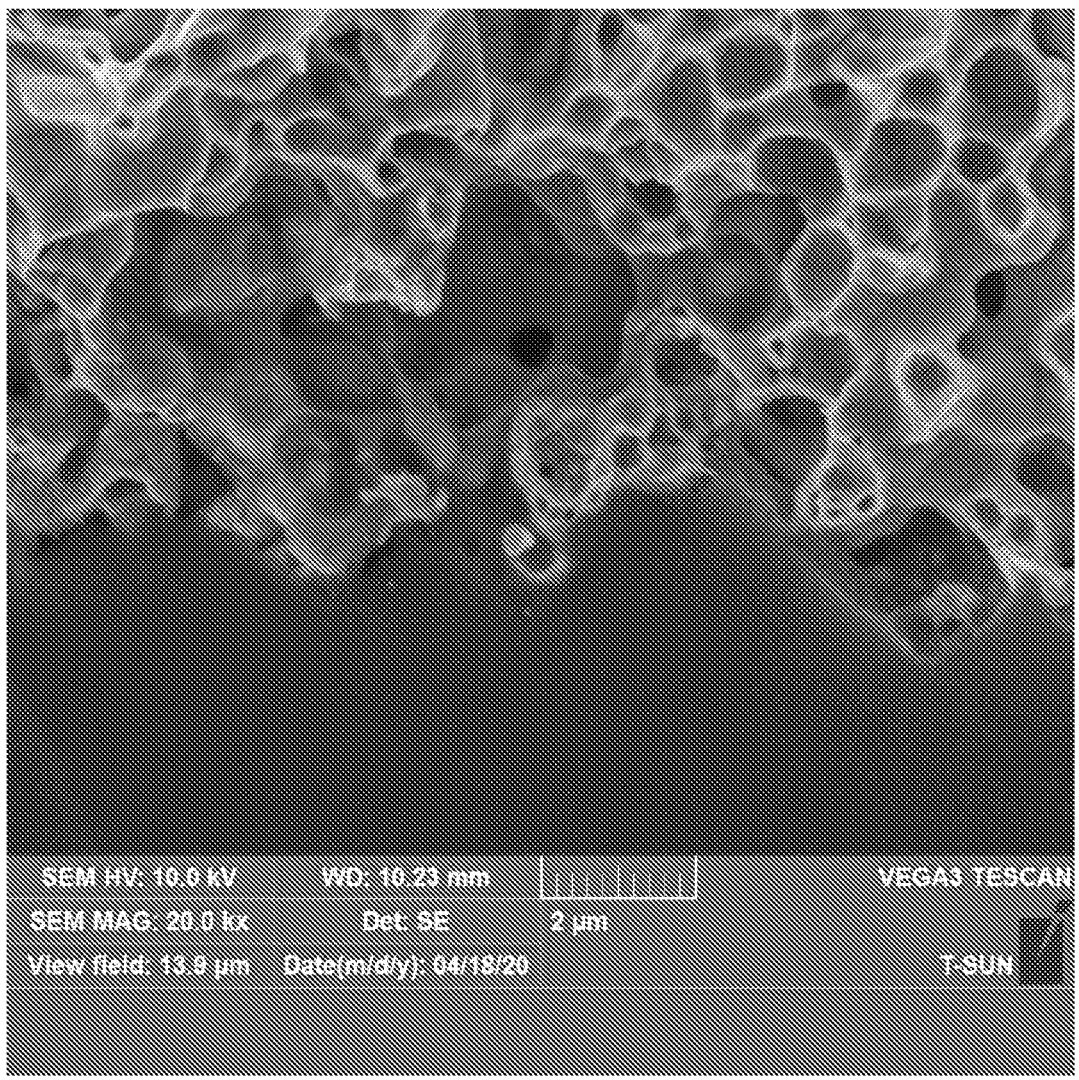
FIG. 8 is a scanning electron micrograph of the high-tension busbar silver paste applied to an N-type solar cell prepared in Comparative Example 1 of the present invention being printed on the N-type solar cell.
Figure 9:
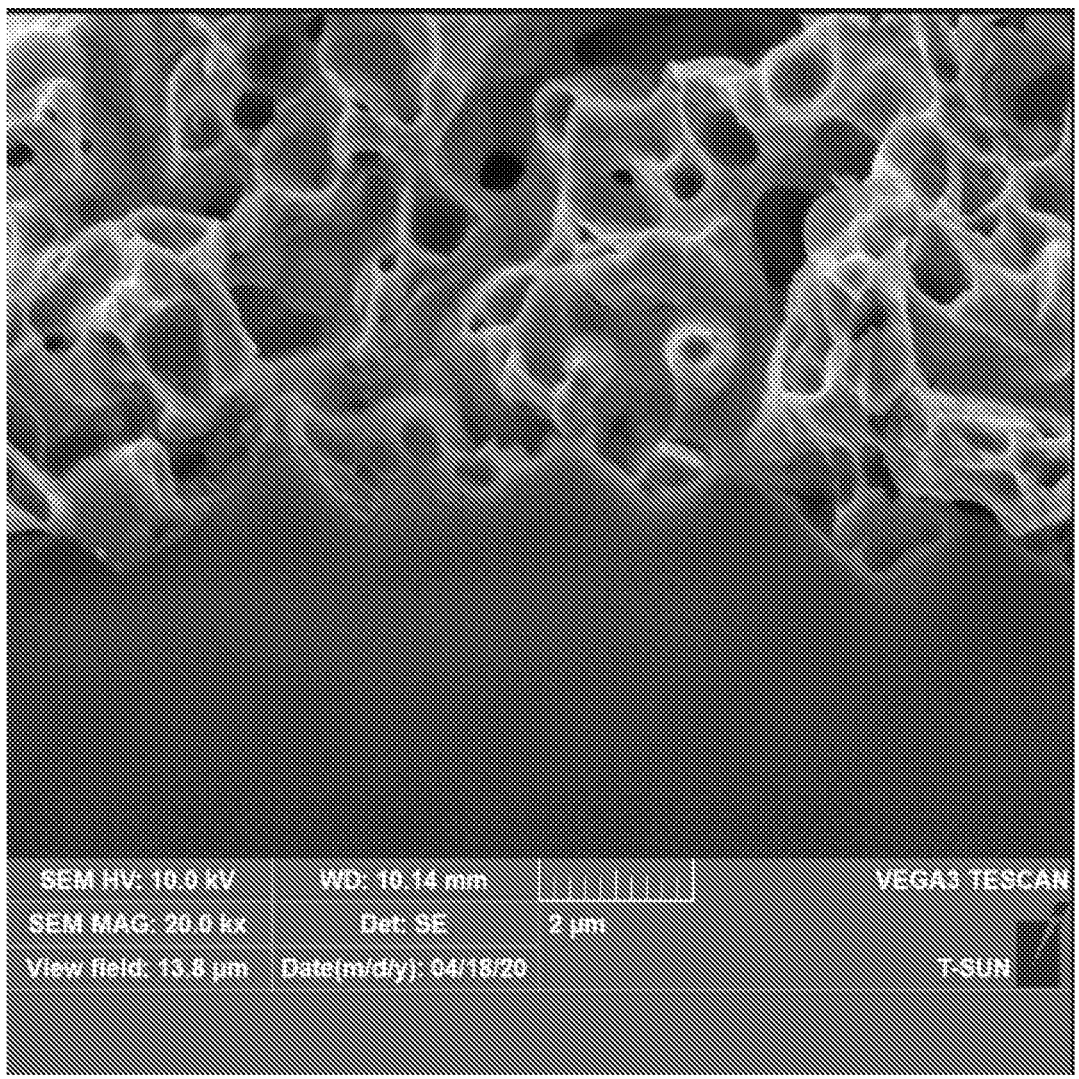
FIG. 9 is a scanning electron micrograph of the high-tension busbar silver paste applied to an N-type solar cell prepared in Comparative Example 2 of the present invention being printed on the N-type solar cell.

The "15 wt % of an organic vehicle: the organic vehicle of the present invention, by mass of 100%, comprises 10 wt % of a resin (polyvinyl butyral resin:acrylic resin:rosin resin=4:5:1), 85 wt % of an organic solvent (texanol:terpineol:tributyl citrate:butyl carbitol acetate=4:4:4:5) and 5 wt % of an organic auxiliary agent (a leveling agent:a thixotropic agent:an antifoaming agent:a drier:a dispersant=1:1:1:1:1), wherein the polyvinyl butyral resin has a molecular weight of 40,000, the acrylic resin has a molecular weight of 20,000, and the rosin resin has a molecular weight of 10,000; and" in Example 1 is replaced with "15 wt % of an organic vehicle: the organic vehicle of the present invention, by mass of 100%, comprises 10 wt % of a resin (polyvinyl butyral resin:rosin resin=9:1), 85 wt % of an organic solvent (texanol:terpineol:tributyl citrate:butyl carbitol acetate=4:4:4:5) and 5 wt % of an organic auxiliary agent (a leveling agent:a thixotropic agent:an antifoaming agent:a drier:a dispersant=1:1:1:1:1), wherein the polyvinyl butyral resin has a molecular weight of 40,000, and the rosin resin has a molecular weight of 10,000; and". The remaining operations are the same as those in Example 1, and the high-tension busbar silver paste applied to the N-type solar cell of FIGS. 3-7, the surface of the busbar line is flat and smooth, and as shown in FIGS. 8-9, the surface of the busbar line is rough with high porosity.

The morphology, electrical performance and welding tension of the busbar are tested by conventional test methods, and specific results are shown in Table 1.

As can be seen from Table 1, the high-tension busbar silver paste applied to the N-type solar cell prepared by the method of the present invention has a good linear structure, high photoelectric conversion efficiency of 21.975% or more and welding tension of 4.2 N or more. Finally, it should be noted that the above descriptions are only preferred examples of the present invention and are not intended to limit the present invention, and any modifications, equivalents and improvements made within the spirit and principle of the present invention should be included in the protection scope of the present invention.

Specification

TABLE 1

Comparison of performances

| | Width of busbar silver paste line/μm | Height of busbar silver paste line/μm | Resistance of busbar silver paste line/mΩ | Resistivity of busbar silver paste line/Ω · cm | Contact resistance of busbar silver paste line/mΩ | Contact resistivity of busbar silver paste line/mΩ · cm$^2$ | Photo-electric conversion efficiency/ % | Open circuit voltage/ V | Filling rate/ % | Short circuit current/ A | Welding tension/ N |
|---|---|---|---|---|---|---|---|---|---|---|---|
| Example 1 | 89.59 | 8.66 | 0.848 | 2.75 × 10$^{-6}$ | 0.66 | 1.16 | 22.059 | 0.675 | 80.81 | 10.83 | 4.9 |
| Example 2 | 81.83 | 10.09 | 0.822 | 2.75 × 10$^{-6}$ | 0.88 | 1.74 | 21.984 | 0.676 | 80.56 | 10.84 | 4.2 |
| Example 3 | 84.78 | 10.05 | 0.848 | 2.73 × 10$^{-6}$ | 0.69 | 1.23 | 22.041 | 0.678 | 80.57 | 10.83 | 4.3 |
| Example 4 | 81.41 | 10.05 | 0.833 | 2.71 × 10$^{-6}$ | 0.93 | 1.86 | 21.996 | 0.675 | 80.76 | 10.84 | 4.6 |
| Example 5 | 86.21 | 9.65 | 0.834 | 2.72 × 10$^{-6}$ | 0.73 | 1.64 | 21.975 | 0.675 | 80.65 | 10.83 | 4.3 |
| Comparative Example 1 | 86.21 | 9.56 | 0.856 | 2.62 × 10$^{-6}$ | 0.86 | 1.98 | 21.886 | 0.665 | 83.07 | 9.89 | 3.8 |
| Comparative Example 2 | 85.21 | 8.96 | 0.865 | 2.65 × 10$^{-6}$ | 0.76 | 1.86 | 21.845 | 0.675 | 83.02 | 9.86 | 3.5 |

Comparative Example 2 has a viscosity of 26.59 Pa·s/25° C. at a rotating speed of 10 rmp, which is measured using the same viscometer.

Experimental Example

The high-tension busbar silver pastes applied to the N-type solar cell prepared in Examples 1-5 and Comparative Examples 1-2 are each screen printed on an N-type silicon wafer printed with finger grids, wherein the silicon wafer used in the description is an N-type TopCon solar cell manufactured by Jolywood (Suzhou) Sunwatt Co., Ltd (the present specification only take this N-type solar cell as an example, and is not only limited to the application of this type of solar cell), the finger grid paste used is a finger grid paste self-made by the applicant, and the N-type silicon wafer printed with the high-tension busbar silver paste of the N-type solar cell is sintered to obtain a busbar silver paste.

Figure 2:
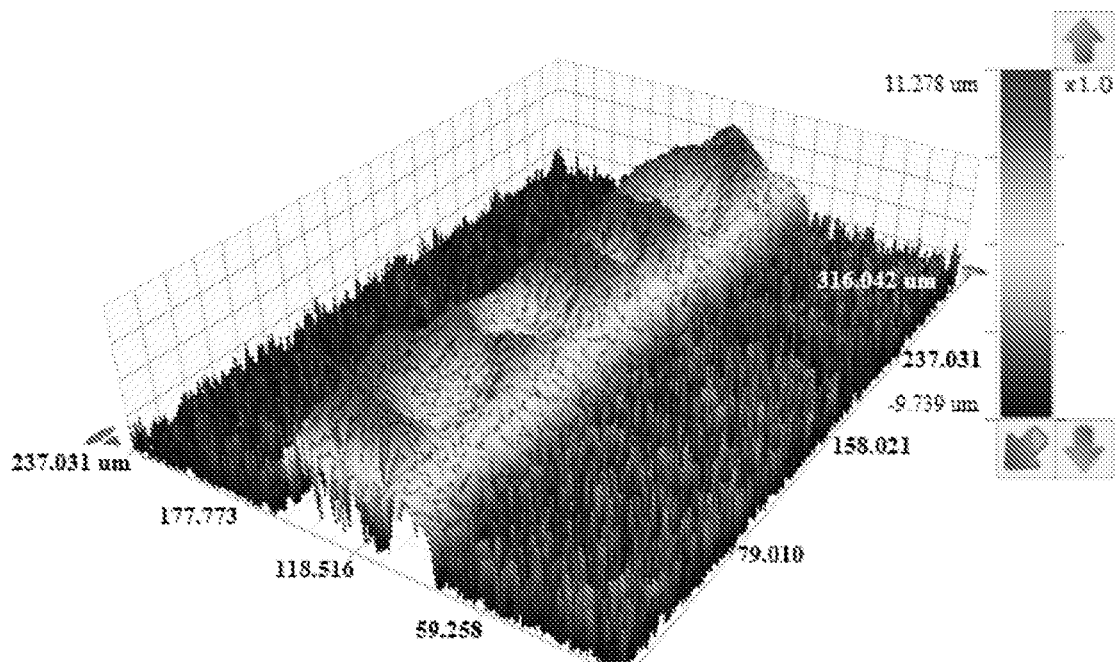
FIG. 2 is a 3D profile scan of the high-tension busbar silver paste applied to the N-type solar cell prepared in Comparative Example 2 of the present invention being printed on the N-type solar cell.
Figure 3:
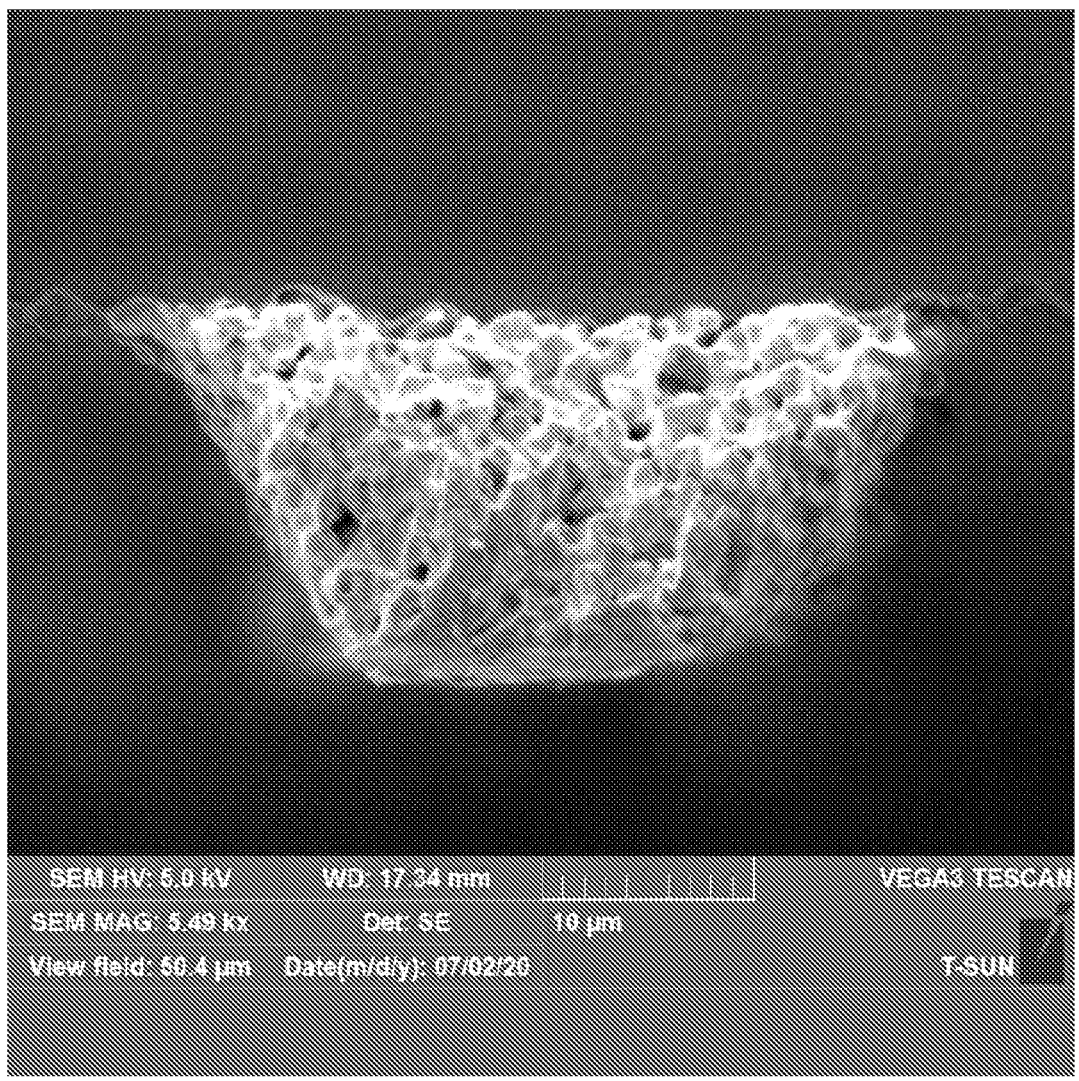
FIG. 3 is a scanning electron micrograph of the high-tension busbar silver paste applied to the N-type solar cell prepared in Example 1 of the present invention being printed on the N-type solar cell.
Figure 4:
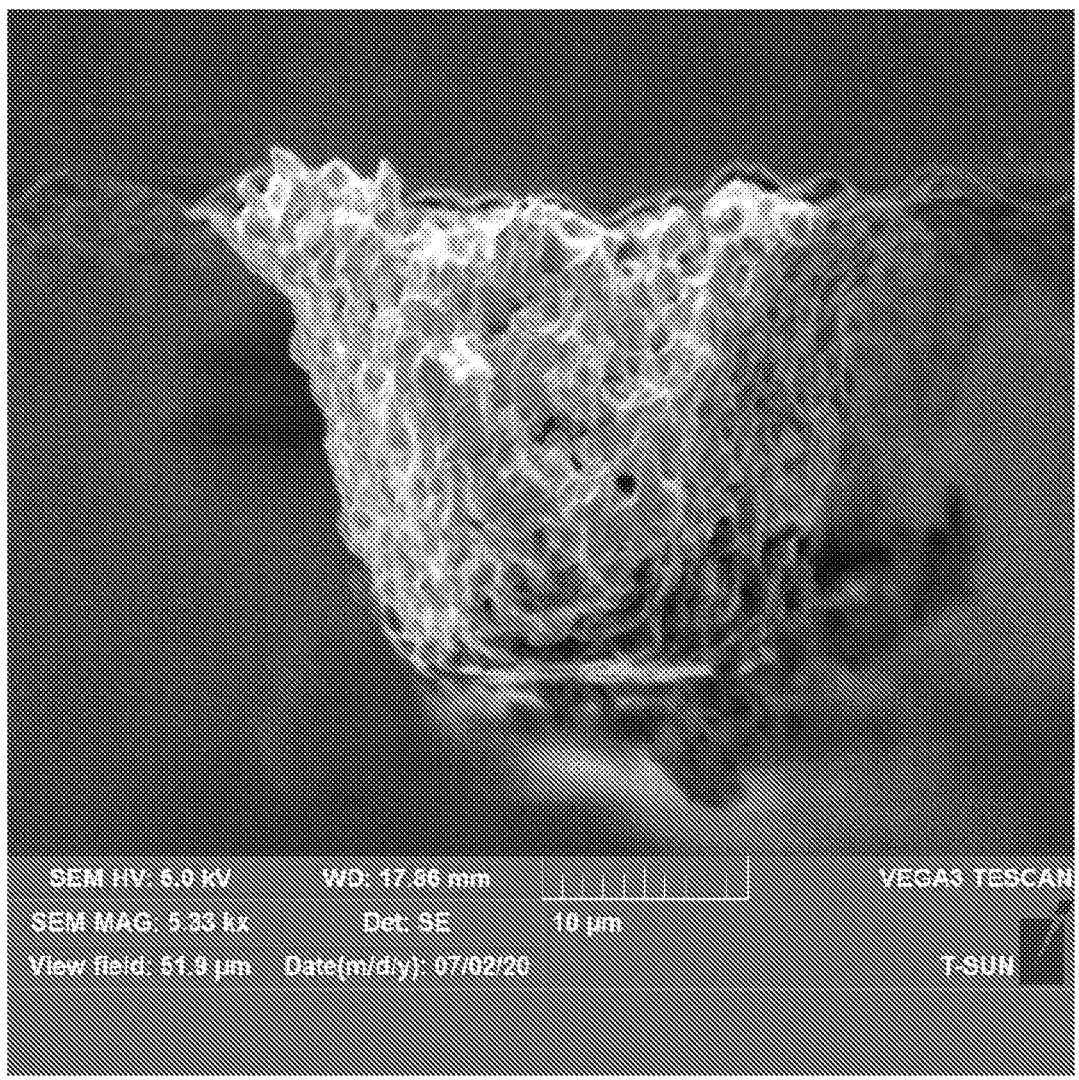
FIG. 4 is a scanning electron micrograph of the high-tension busbar silver paste applied to the N-type solar cell prepared in Example 2 of the present invention being printed on the N-type solar cell.
Figure 5:
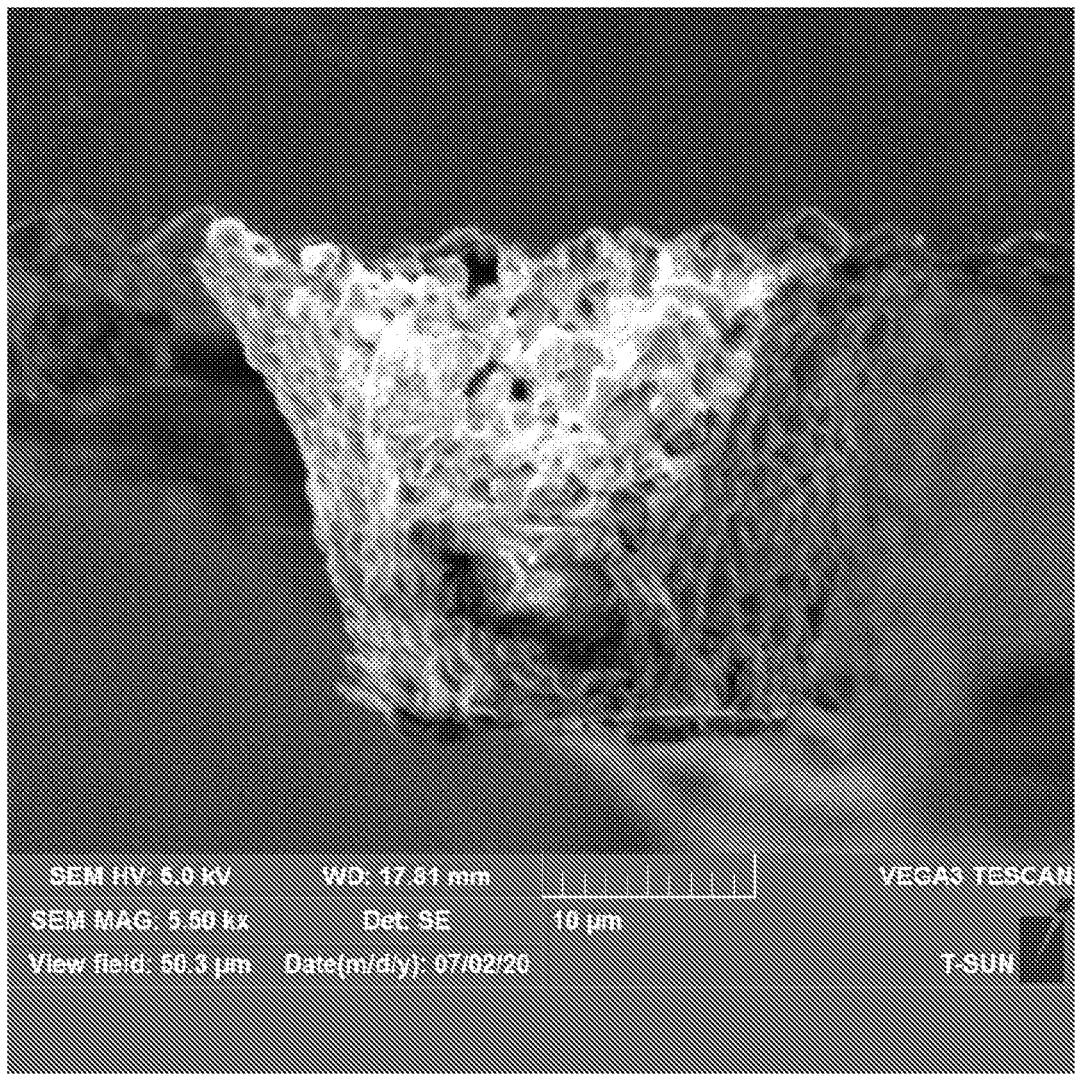
FIG. 5 is a scanning electron micrograph of the high-tension busbar silver paste applied to the N-type solar cell prepared in Example 3 of the present invention being printed on the N-type solar cell.
Figure 6:
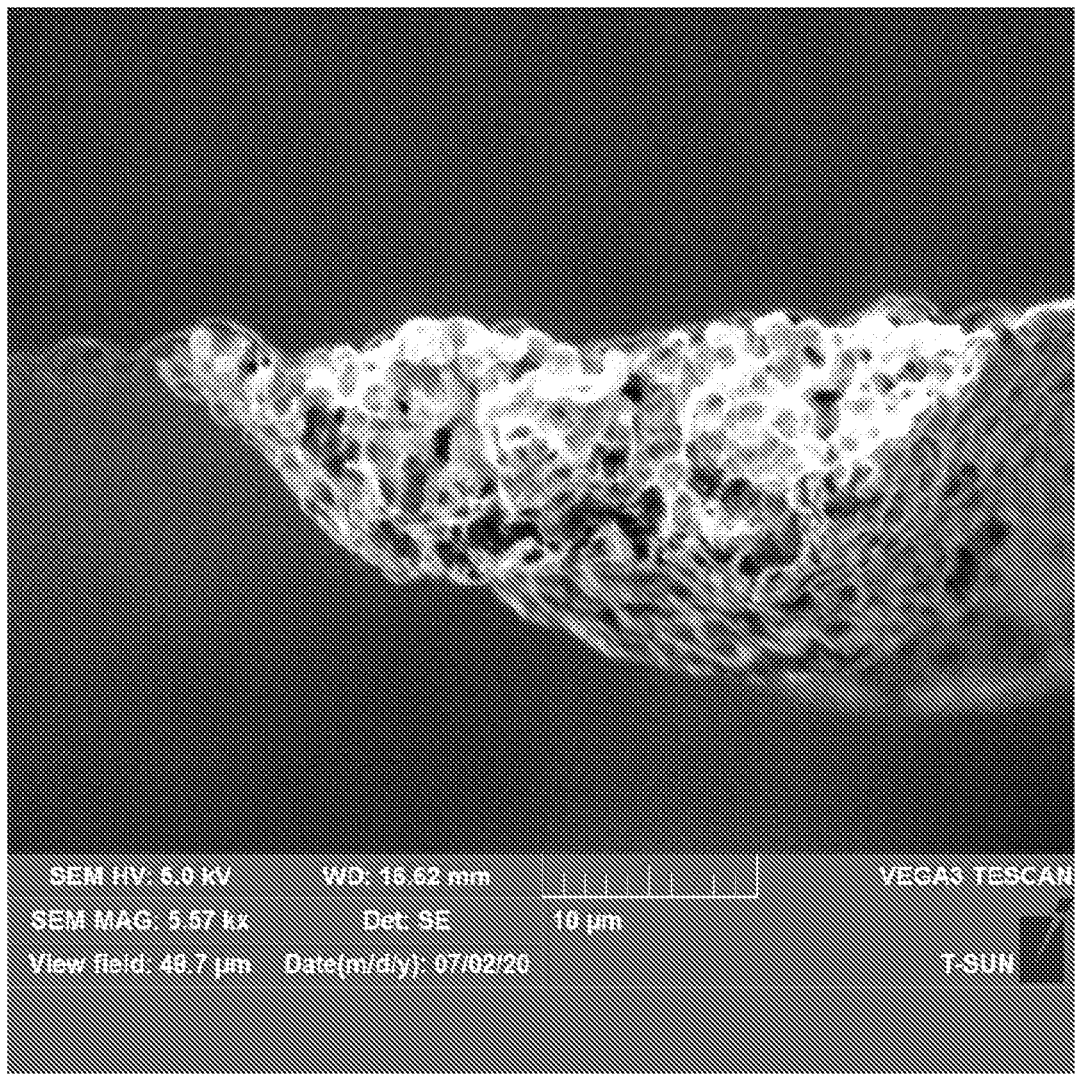
FIG. 6 is a scanning electron micrograph of the high-tension busbar silver paste applied to the N-type solar cell prepared in Example 4 of the present invention being printed on the N-type solar cell.
Figure 7:
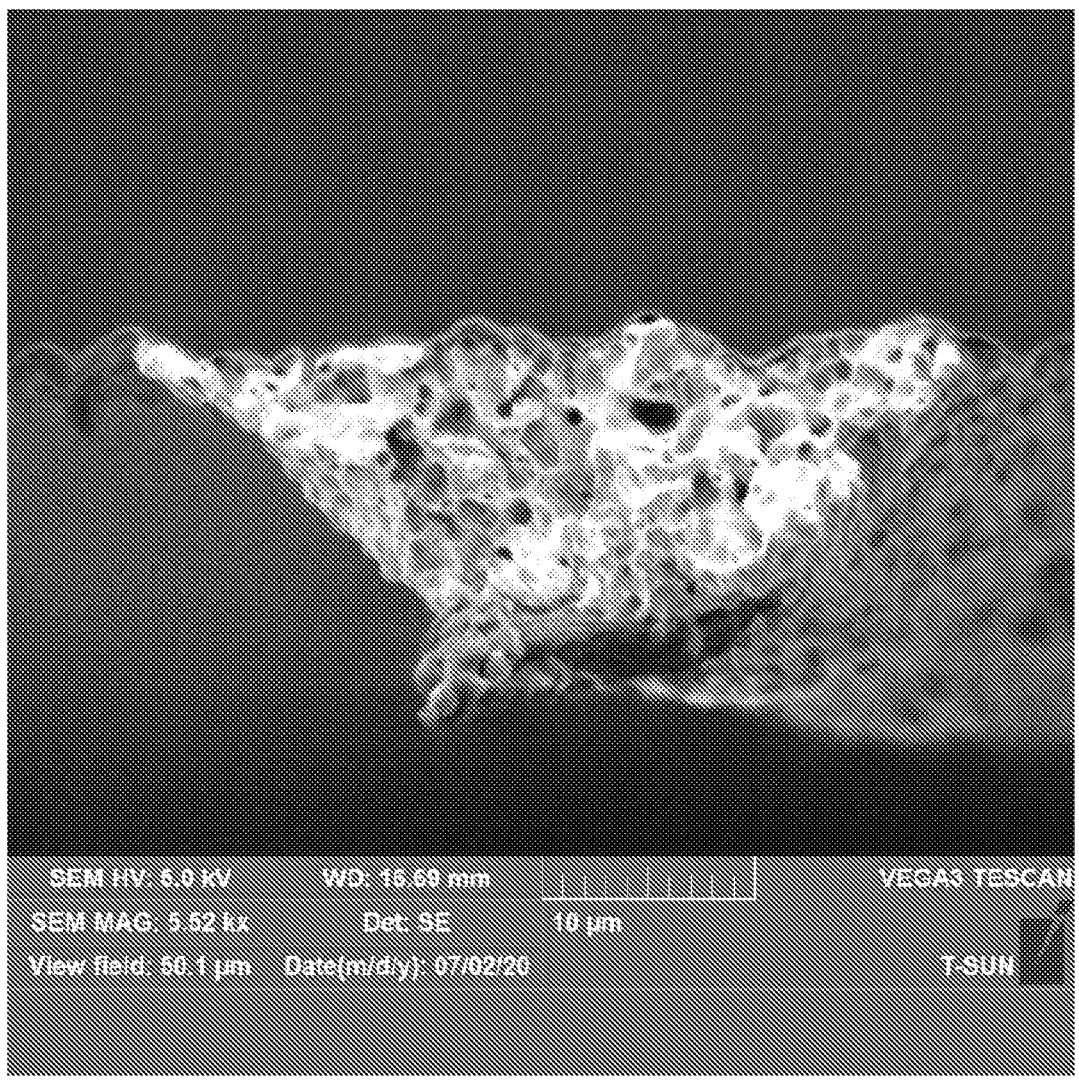
FIG. 7 is a scanning electron micrograph of the high-tension busbar silver paste applied to an N-type solar cell prepared in Example 5 of the present invention being printed on the N-type solar cell.

The morphology of the printed busbar silver pastes of Example 1 and Comparative Example 1 is observed using a profile instrument, and the results are shown in FIGS. 1 and 2. As can be seen from FIG. 1, the high-tension busbar silver paste applied to the N-type solar cell prepared in Example 1 has smooth linearity and flat busbar surface after printing, and as can be seen from FIG. 2, the high-tension busbar silver paste applied to the N-type solar cell prepared without the combined use of the spherical silver powder has poor linearity and low leveling property after printing.

The morphology of the printed busbar silver pastes prepared in Examples 1-5 and Comparative Examples 1-2 is observed using a scanning electron microscope. As shown in

What is claimed is:

1. A high-tension busbar silver paste for an N-type solar cell comprising 80-95% of a silver powder, 8-20% of an organic vehicle and 1-5% of a copper-bismuth-manganese-tellurium glass powder by weight;
   wherein
   the silver powder is a mixture of a spherical silver powder A and a spherical silver powder B, which comprises 70-85% of the spherical silver powder A and 15-30% of the spherical silver powder B by weight;
   the spherical silver powder A has a median particle size of 700-900 nm and a tapped density of 5-6 g/mL, and the spherical silver powder B has a median particle size of 280-450 nm and a tapped density of 4-5 g/mL;
   the copper-bismuth-manganese-tellurium glass powder has a median particle size of 0.7-1 μm and a softening temperature of 600-800° C.;
   the organic vehicle comprising 6-15% of a resin, 80-85% of an organic solvent and 5-10% of an organic auxiliary agent by weight;
   the resin has a molecular weight of 1000-50,000 that comprises 3-5% of polyvinyl butyral resin in the organic vehicle and 5-10% of acrylic resin in the organic vehicle by weight.

2. The high-tension busbar silver paste according to claim 1, wherein the copper-bismuth-manganese-tellurium glass powder per 100 mol is prepared by mixing the following compounds: 50-60 mol % of a copper-containing compound, 2-3 mol % of a bismuth-containing compound, 5-7 mol % of a manganese-containing compound and 2-2.4 mol % of a tellurium-containing compound.

3. The high-tension busbar silver paste according to claim 2, wherein the copper-bismuth-manganese-tellurium glass powder further includes the following compounds: 20-40 mol % of a silicon-containing compound, 0.5-1 mol % of an aluminum-containing compound and 3-3.6 mol % of a titanium-containing compound.

4. The high-tension busbar silver paste according to claim 2, wherein the compounds are at least one of an oxide, a halide, a nitrate compound, a nitrite compound, a carbonate compound, a bicarbonate compound, a sulfate compound and a phosphate compound.

5. The high-tension busbar silver paste according to claim 1, wherein the resin further comprises at least one of ethylcellulose resin, rosin resin, and phenolic resin.

6. The high-tension busbar silver paste according to claim 1, wherein the organic solvent is at least one of texanol, terpineol, tributyl citrate and butyl carbitol acetate.

7. The high-tension busbar silver paste according to claim 1, wherein the organic auxiliary agent is at least one of a leveling agent, a thixotropic agent, an antifoaming agent, a drier, a dispersing agent and a viscosity reducer.

8. A method preparing for the high-tension busbar silver paste of claim 1, comprising the following steps:
  step I: adding the organic vehicle and the glass powder into a centrifuge tube and uniformly mixing, and then placing the centrifuge tube into a centrifuge and centrifuging for 1-3 times to obtain a glass paste, wherein the centrifuge has a rotating speed of 800-1200 rmp and a centrifuging time of 3-7 min;
  step II: placing the glass paste into a three-roller machine for three-roller grindings, wherein the three-roller machine has a roller spacing of 5-40 µm and a rotating speed of 100-200 rmp; and
  step III: adding the silver powder into the glass paste after the three-roller grindings in the step II, and centrifuging for 2 times at a rotating speed of 500-600 rmp to obtain the high-tension busbar silver paste, wherein the high-tension busbar silver paste has a viscosity of 20-30 Pa s/25° C. at a rotating speed of 10 rmp.

* * * * *